United States Patent
Polykarpov

[11] Patent Number: 6,030,740
[45] Date of Patent: Feb. 29, 2000

[54] TWO-SIDED IMAGING MATERIAL

[75] Inventor: Alexander Y. Polykarpov, Mason, Ohio

[73] Assignee: Cycolor, Inc., Miamisburg, Ohio

[21] Appl. No.: 09/266,615

[22] Filed: Mar. 11, 1999

Related U.S. Application Data

[60] Provisional application No. 60/077,790, Mar. 12, 1998.

[51] Int. Cl.[7] .................................................. G03C 1/72
[52] U.S. Cl. .................. 430/138; 430/271.1; 430/281.1; 430/288.1
[58] Field of Search .................................... 430/138, 202, 430/211, 952, 270.1, 333, 356

[56] References Cited

U.S. PATENT DOCUMENTS

| | | | |
|---|---|---|---|
| 3,672,935 | 6/1972 | Miller et al. | 117/36.8 |
| 3,732,120 | 5/1973 | Brockett et al. | 117/16 |
| 4,440,846 | 4/1984 | Sanders et al. | 430/138 |
| 4,772,541 | 9/1988 | Gottschalk et al. | 430/339 |
| 4,912,011 | 3/1990 | Yamamoto et al. | 430/138 |
| 4,962,010 | 10/1990 | Colyer et al. | 430/138 |
| 5,118,590 | 6/1992 | Kakimi | 430/138 |
| 5,550,627 | 8/1996 | Dowler et al. | 355/326 M |
| 5,783,353 | 7/1998 | Camillus et al. | 430/138 |
| 5,916,727 | 6/1999 | Camillus et al. | 430/138 |

*Primary Examiner*—Janet Baxter
*Assistant Examiner*—Yvette M. Clarke
*Attorney, Agent, or Firm*—Thompson Hine & Flory LLP

[57] ABSTRACT

A new digital printer media which allows to create images on both sides of a single sheet is proposed. The media is printed in a new Cycolor printer which utilizes two LED printer heads and one developer head/device. The film consists of the top and the bottom layers of capsules/developer coats on clear polyester (top and bottom) with the white polyester with adhesive on both sides as the separator. The color producing capsules/developer mixture is coated on clear polyester. The coated film is then laminated with white polyester containing adhesive on both sides. The top side of the white polyester remains protected by the removable liner. Thus created film is then used to laminate another layer of capsule/developer coated clear polyester. The double sided film is thus created. Following exposure from both sides will occur independently by a set of two LED heads. Developing pressure can be applied from one side. Two images can be formed at the same time on both sides of a single sheet.

10 Claims, 1 Drawing Sheet

TWO-SIDED IMAGING MATERIAL

CROSS-REFERENCE TO RELATED APPLICATION(S)

The present invention claims priority under 35 U.S.C. §119 from Provisional Patent Application Ser. No. 60/077,790, filed Mar. 12, 1998.

BACKGROUND OF THE INVENTION

A digital printer media which enables one to form images on both sides of a single sheet of the media is provided. This invention is an improvement in the invention described commonly assigned U.S. Pat. Nos. 4,440,846 and 5,783,353, which disclose self-contained imaging assemblies in which a layer of microcapsules containing a chromogenic material and a photohardenable or photosoftenable composition, and a developer, which may be in the same or a separate layer from the microcapsules, is image-wise exposed, the microcapsules ruptured, and an image is produced by the differential reaction of a chromogenic material and the developer. U.S. Pat. No. 5,783,353 more specifically discloses a self-contained media in which the photosensitive microcapsules and the developer are sealed between two plastic films such that the user never comes into contact with the chemicals which form the image unless the media is deliberately destroyed. The imaging materials described in the referenced patents are designed to yield an image on only one face of the support. It would be desirable to have a media in which images can be formed on both faces of the support.

SUMMARY OF THE INVENTION

The imaging material of the present invention comprises a pair of transparent supports (e.g. PET) which are positioned on the outside of layers of either a mixture of photosensitive microcapsules and developer or individual layers of microcapsules and developer. In the middle of the imaging material is an opaque structure such as a film of white polyester. To manufacture the unit, the microcapsules and developer, mixed or in separate layers, may be coated on the clear PET films. The coated films may then be laminated with the white polyester film which has been coated on both faces with an adhesive. A subbing layer is preferably provided on the clear PET films to provide a "sealed" unit, i.e., one in which the films cannot be separated without destruction of the unit. Of course, other manufacturing processes could also be used.

To record images the imaging material can be scanned on each face with an LED print head and developed by application of pressure to the unit. An image appears on each face of the unit. The media can be printed using a printer which incorporates an LED print head in combination with one LED/developer head of the type described in U.S. Pat. No. 5,550,627. Alternatively, two LED print heads can be used and a separate developer head can be used. Preferably, the LED print heads will simultaneously scan each side of the film to form latent images on each outer face of the media followed by a pressure scan. Since pressure applied to one side of the media can be transmitted through the media to the opposite side, only one pressure head is needed. Of course, the media can be exposed on each face and developed using any of the exposure and developing equipment that is taught in the art as it relates to imaging materials employing photosensitive microcapsules of this type, e.g., laser scan, LCD, laser-addressed LCD, reflection imaging, etc. Other development devices such as pressure roller development could be used.

DETAILED DESCRIPTION OF THE INVENTION

Figure 1:
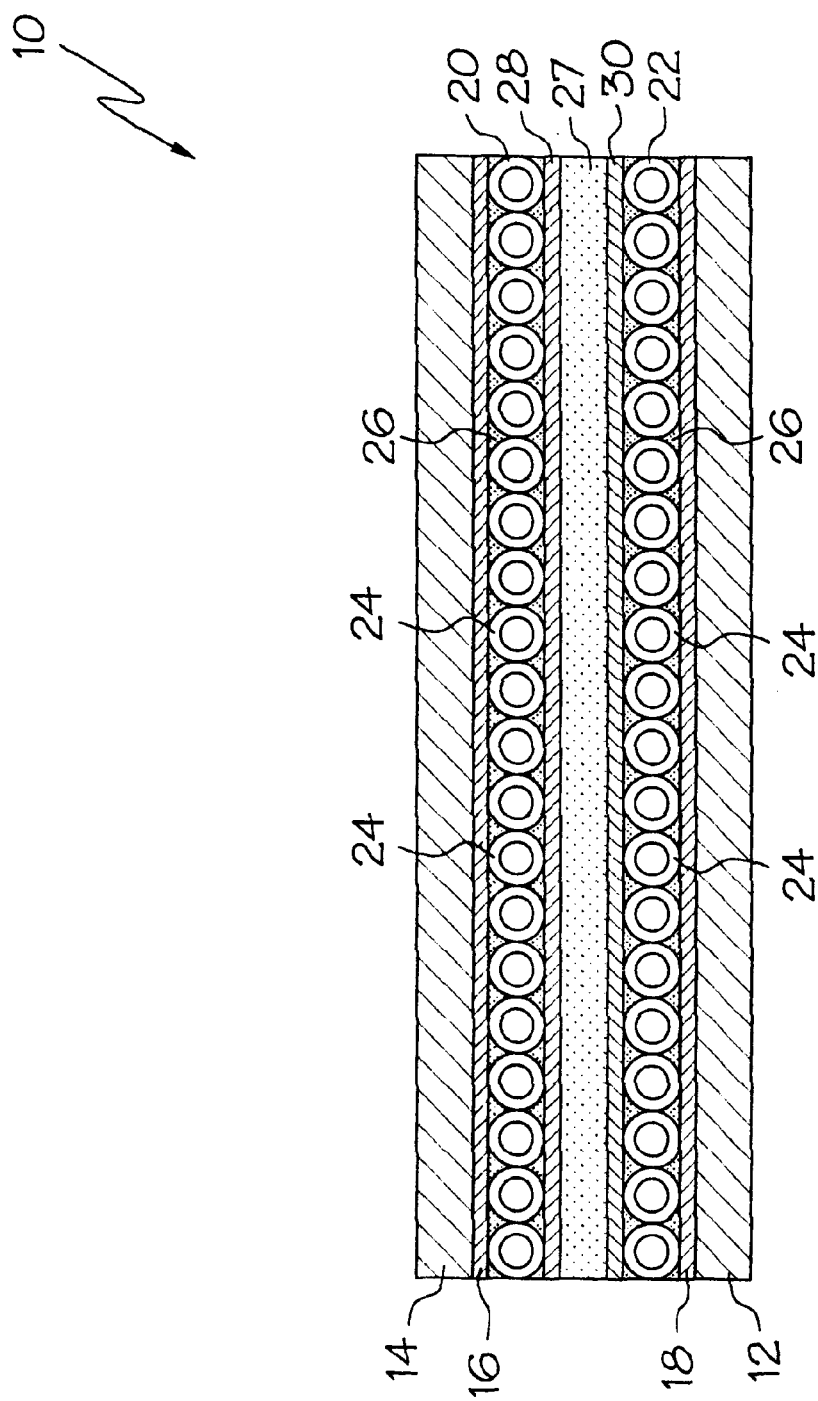
FIG. 1 is a schematic cross-sectional view of one example of the imaging material of the present invention in which the microcapsules and the developer are mixed in a single layer.

FIG. 1 illustrates one embodiment of a photosensitive material in accordance with the invention. The photosensitive material is generally indicated by the numeral 10 and includes first and second transparent films 12 and 14 which are respectively provided with subbing layers 16 and 18 and mixed layers 20 and 22 of photosensitive microcapsules 24 and developer material 26. These films are secured to an opaque support such as titanium dioxide containing PET. The microcapsule carrying films are secured to the opaque film 27 by a pair of adhesive layers 28 and 30. Useful photohardenable compositions, photoinitiators, chromogenic materials, carrier oils and encapsulation techniques for making the microcapsules are disclosed in U.S. Pat. No. 4,440,846 which is herein incorporated by reference. Preferred photohardenable compositions are described in commonly assigned U.S. Pat. No. 4,772,541. Also useful in the present invention is a silver-based photohardenable microencapsulated system such as that described in U.S. Pat. Nos. 4,912,011; 5,091,280 and 5,118,590 and other patents assigned to Fuji Photo Film Co. Images are formed in the present invention in the same or an analogous manner as described in U.S. Pat. No. 4,440,846. Preferably a direct digital transmission imaging technique is employed using a modulated LED print head as mentioned above.

When mixed in a single layer, the layer typically contains about 20 to 80% (dry weight) of the developer, about 80 to 20% (dry weight) microcapsules and about 0 to 20% binder. The layer is typically applied in a dry coat weight of about 8 to 20 $g/m^2$. An example of such a coating formulation is illustrated in Example 2 below. Binder materials which may be utilized include polyvinyl alcohol, polyacrylamide, and acrylic lattices. When the microcapsules are provided as a separate layer from the developer, a binder such a polyethylene oxide (PEO) having a molecular weight of about 500,000 can be incorporated in the microcapsule layer. A particular useful binder is poly(2-ethyl-2-oxazoline) available under the tradename, AQUAZOL, from Polymer Chemistry Innovations, Inc. Generally, the binder is added to the microcapsule layer in an amount of about 2 to 10% based on the microcapsules.

The outer transparent supports 12 and 14 through which the image is viewed can be formed from any transparent polymeric film. A film will be selected which provides good photographic quality when viewing the image. Preferably, a film will be used which is resistant to yellowing and contains a UV absorber. The preferred substrate is polyethylene terephthalate (PET) which is a clear polymeric material. Typically, each of the PET supports has a thickness of about 2 to 4 mils.

Various polymers may be applied as subbing layers 16 and 18 between the outer substrates 12 and 14 and the microcapsule layer. The subbing layer may be applied in a coat weight of about 1 to 4 $g/m^2$ (dry weight). Useful polymers include polyethylene oxide and, more particularly, AQUAZOL, and hydroxy containing polymers which can bond to the microcapsules such as partially hydrolyzed polyesters and sulfonated polyesters of aromatic acids and aliphatic or cycloaliphatic alcohols and salts thereof such as the AQ polymers available from Eastman Chemical, e.g., AQ38 and AQ55.

The middle film 27 is preferably an opaque film such as PET containing a white opacifying agent. In a preferred embodiment, the middle support is sufficiently opaque that when a the imaging sheet is exposed to radiation through the transparent support, the middle support is effective to prevent the radiation from penetrating to other imagine surface. Generally, the opaque support will be available commercially. Some other products which are useful include paper, cardboard, polyethylene, polyethylene-coated paper, etc. These products are composites or admixtures of the polymer and the pigment in a single layer, films or coated papers. Alternatively, the opacifying agent can be provided in a separate layer underlying or overlying a polymer film such as PET. The opacifying agent employed in these materials is generally an inert, light-reflecting material which exhibits a white opaque background. Materialsuseful as the opacifying agent include inert, light-scattering white pigments such as titanium dioxide, magnesium carbonate or barium sulfate. In a preferred embodiment, the opacifying agent is titanium dioxide. Most preferably the opaque support is a polyethylene terephthalate support containing about 10% titanium dioxide to form a bright white colored opaque support. Such a support is commercially available from ICI, Ltd. under the product designation Melinex.

To seal the middle support with the outer transparent supports, the middle support is coated on both surfaces with an adhesive 28 and 30. One adhesive useful in this present invention is an aqueous-based adhesive such as Aerosett 2177 or Aerosett 2550 both of which are commercially available from Ashland Chemical Co.; PD 0681, AP 6903, and W 3320 available from H. B. Fuller, or a solvent-based adhesive such as PS 508 sold by Ashland Chemical Co. or an acrylic solvent based pressure sensitive adhesive such as 300 adhesive from 3M Corp. The adhesives may be used separately or in combination. Preferably, the adhesive is transparent or translucent and most preferably it is a transparent aqueous- based adhesive which remains clear even after subjecting the assembly to radiation and pressure necessary to image-wise expose and rupture the microcapsules. The amount of the adhesive will vary depending upon the nature of the adhesive and the support. The adhesive is generally applied in an amount of about 2 to 20 $g/m^2$.

In an alternate embodiment, the developer 26 and the photohardenable microcapsules 24 can be coated in separate layers on the same or different supports. Usually the developer layer will be coated on the outer transparent supports and the developer layer will be internally coated with the photosensitive microcapsules. Alternatively, the transparent films can be coated with the developer and the microcapsules can be coated on both sides of the opaque middle layer. When the developer layer is coated on the transparent films the subbing layers 16 and 18 may not be necessary.

Spacers or anti-blocking agents can be used to improve media stability and thereby extend the shelf life of the imaging system when the microcapsules and developer are coated on separate supports. If the microcapsule layer and the developer layer remain in close proximity to each other after development, continued reaction between the image-forming material from the ruptured microcapsules and the developer material can cause the image to darken in some cases. Where this is a problem, spacers may be used. Typically, useful spacers are particles having high crush resistance such as glass microspheres, ceramic particles, and the like. Examples of such materials include 560/10,000 glass microspheres from 3M which have a crush resistance of 10,000 psi, a particle size of about 35 microns and include about 90% "floaters" (low density particles); and zeeospheres from Zeeosphere Industries, e.g., Zeeosphere Grade 200 having a mean particle size of about 5 microns and Zeeosphere 600 having a mean particle size of about 10 microns. These spacers may be incorporated in the developer layer or in the microcapsule layer. The spacers are typically used in an amount of about 1 to 10% based on the microcapsules.

In some cases it may also be desirable to coat the developer layer with an antiblocking agent. Antiblocking agents are polymeric materials which are coated on the developer layer to prevent the developer layer from sticking to the mnicrocapsule layer but which do not deny the color precursor access to the color developer to form an image with good density. Representative examples of useful antiblocking agents include elastomeric materials such as Neoprene emulsion from DuPont; Lytron GA-5705, a polystyrene emulsion from Morton International; and Hycar, a nitrile emulsion from B. F. Goodrich.

When the developer is coated on one support and the microcapsules on a separate support as in Example 1, the peripheral edges of the self-contained assembly can be bonded using any of the conventional means used to seal polymeric materials such as polyethylene terephthalate. For example, films can be sealed using an adhesive or they may be heat sealed together or they can be sealed by any other technique. Preferably, the PET is sealed using a heat sealing method such as a heat knife. While the seal is described as being at the periphery, it will be appreciated that the seal can be inset from the periphery, e.g., by the distance of a border, provided that the seal is interposed between the imaging chemicals and the users.

In accordance with one embodiment of the invention, a full color imaging system is provided in which the microcapsules are in three sets respectively containing cyan, magenta and yellow color formers respectively sensitive to red, green, and blue light respectively. However digital imaging systems do not require the use of visible light and as such, sensitivity can be extended into the UV and IR. For optimum color balance, the visible-sensitive microcapsules are sensitive ($\lambda$max) at about 450 nm, 540 nm, and 650 mn, respectively. Such a system is useful with visible light sources in direct transmission or reflection imaging. Such a material is useful in making contact prints, projected prints of color photographic slides, or in digital printing. They are also useful in electronic imaging using lasers or pencil light sources of appropriate wavelengths.

The photohardenable composition in at least one and possibly all three sets of microcapsules can be sensitized by a cationic dye-borate complex as described in U.S. Pat. No. 4,772,541. Because the cationic dye-borate anion complexes absorb at wavelengths greater than 400 nm, they are colored and the unexposed dye complex present in the microcapsules in the non-image areas can cause undesired coloration in the background area of the final picture. Typically, the mixture of microcapsules is greenish and can give the background areas a greenish tint. Means for preventing or reducing undesired coloration in the background as well as the developed image include reducing the amount of photoinitiator used and adjusting the relative amounts of cyan, magenta and yellow microcapsules as shown in the example which follows. In this regard it is desirable to include a disulfide compound in the photosensitive composition to reduce the amount of dye-borate that may be required as described in detail in U.S. Pat. No. 5,783,353.

The photohardenable compositions of the present invention can be encapsulated in various wall formers using techniques known in the area of carbonless paper including coacervation, interfacial polymerization, polymerization of one or more monomers in an oil, as well as various melting, dispersing, and cooling methods. To achieve maximum sensitivities, it is important that an encapsulation technique be used which provides high quality capsules which can be differentially ruptured based upon changes in the internal phase viscosity. Because the dye-borate tends to be acid sensitive, encapsulation procedures conducted at higher pH (e.g., greater than about 6) are preferred.

Melamine-formaldehyde capsules are particularly useful. It is desirable in the present invention to provide a pre-wall in the preparation of the microcapsules. See U.S. Pat. No. 4,962,010 for a particularly preferred encapsulation using pectin and sulfonated polystyrene as system modifiers. The formation of pre-walls is known, however, the use of larger amounts of the polyisocyanate precursor is desired. A capsule size should be selected which minimizes light attenuation. The mean diameter of the capsules used in this invention typically ranges from approximately 1 to 25 microns. As a general rule, image resolution improves as the capsule size decreases. Technically, however, the capsules can range in size from one or more microns up to the point where they become visible to the human eye.

The developer materials and coating compositions containing the same conventionally employed in carbonless paper technology are useful in the present invention. Illustrative examples are clay minerals such as acid clay, active clay, attapulgite, etc.; organic acids such as tannic acid, gallic acid, propyl gallate, etc.; acid polymers such as phenol-formaldehyde resings, phenol acetylene condensation resins, condensates between an organic carboxylic acid having at least one hydroxy group and formaldehyde, etc.; metal salts of aromatic carboxylic acids or derivatives thereof such as zinc salicylate, tin salicylate, zinc 2-hydroxy napththoate, zinc 3,5 di-tert butyl salicylate, zinc 3,5-di-(a-methylbenzyl) salicylate, oil soluble metals salts or phenol-formaldehyde novolak resins (e.g., see U.S. Pat. Nos. 3,672, 935 and 3,732,120) such as zinc modified oil soluble phenol-formaldehyde resin as disclosed in U.S. Pat. No. 3,732,120, zinc carbonate etc. and mixtures thereof. The preferred developer material is one which will permit room temperature development such as zinc salicylate and particularly a mixture of zinc salicylate with a phenol formaldehyde resin. Especially preferred for use is a mixture of zinc salicylate or a zinc salicylate derivative and phenol-formaldehyde resin and, more particularly, a mixture of 25% HRJ 11177, a phenolic resin from Schenectady Chemical Company and 75% zinc salicylate. The particle size of the developer material is important to obtain a high quality image. The developer particles should be in the range of about 0.2 to 3 microns and, preferably, in the range of about 0.5 to 1.5 microns. A suitable binder such as polyvinyl alcohol (PVA) is mixed with the developer, typically in an amount of about 1 to 8% by weight, to prepare a coating composition. When applied as a separate layer, the amount of developer material coated on the transparent support is generally in the range of about 4 to 12 g/m$^2$ and is typically about 8 g/m$^2$.

Microcapsules useful in practicing the present invention are preferably prepared and blended to form a photohardenable layer as illustrated below. In accordance with the invention, the amount of photoinitiator in the microcapsules has been reduced and the ratio of cyan to magenta and yellow capsules has been adjusted to provide a layer with minimal tint so as not to detract from the whiteness of the background.

The invention is illustrated in more detail by the following non-limiting example.

EXAMPLE 1

Model Laboratory Capsule Preparation

1. Into a 600 ml stainless steel beaker, 110 g water and 4.6 g isobutylene maleic anhydride copolymer (dry) are weighed.
2. The beaker is clamped in place on a hot plate under an overhead mixer. A six-bladed, 45° pitch, turbine impeller is used on the mixer.
3. After thoroughly mixing, 4.0 g pectin (polygalacturonic acid methyl ester) is slowly sifted into the beaker. This mixture is stirred for 2 hours at room temperature (800–1200 rpm).
4. The pH is adjusted to 7.0 with 20% sulfuric acid.
5. The mixer is turned up to 3000 rpm and the internal phase is added over a period of 10–15 seconds. Emulsification is continued for 10 minutes. Magenta and yellow precursor phases are emulsified at 25°–30° C. Cyan phase is emulsified at 45°–50° C. (oil), 25°14 30° C. (water).
6. At the start of emulsification, the hot plate is turned up so heating continues during emulsification.
7. After 20 minutes, the pH is adjusted to 8.25 with 20% sodium carbonate, the mixing speed is reduced to 2000 rpm, and a solution of melamine-formaldehyde prepolymer is slowly added which is prepared by dispersing 3.9 g melamine in 44 g water, adding 6.5 g formaldehyde solution (37%) and heating at 60° C. until the solution clears plus 30 minutes.
8. The pH is adjusted to 6.0, the beaker is covered with foil and placed in a water bath to bring the temperature of the preparation to 65° C. When 65° C. is reached, the hot plate is adjusted to maintain this temperature for a two hour cure time during which the capsule walls are formed.
9. After curing, mixing speed is reduced to 600 rpm, formaldehyde scavenger solution (7.7 g urea and 7.0 g water) is added and the solution is cured another 40 minutes.
10. The pH is adjusted to 9.5 using a 20% NaOH solution and stirred overnight at room temperature.

Three batches of microcapsules are prepared as above for use in a full color imaging sheet using the three internal phase compositions set forth below.

| Yellow Capsule Internal Phase (420 nm) | |
| --- | --- |
| TMPTA | 35 g |
| DPHPA | 15 g |
| 3-thionyl-7-diethylaminocoumarin | 15 g |
| 2-Mercaptobenzoxazole (MBO) | 2.0 g |
| 2,6-Diisopropylaniline | 1.0 g |
| Reakt Yellow (BASF) | 5.0 g |
| Desmodur N-100 (Bayer Biuret Polyisocyanate Resins | 3.33 g |
| Magenta Capsule Internal Phase (550 nm) | |
| TMPTA | 50 g |
| 1,1'-dibutylindocarbocyanine-methyltriphenylborate complex | 0.2 g |
| 2.6-Diisopropylaniline | 2.0 g |
| HD5100 (Magenta color precursor from Hilton-Davis Chemical Co.) | 12.0 g |
| Cyan Capsule Internal Phase (650 nm) | |
| TMPTA | 50 g |
| 1-1'-diheptylindocarbocyanine-hexyltriphenylborate complex | 0.31 g |
| 2,6-Diisopropylaniline | 2.0 g |
| Cyan Precursor (CP-177 of Hilton-Davis Chemical Co.) | 6 g |

Microcapsules prepared as above can be mixed to prepare the following coating composition:

| | |
|---|---|
| Cyan Capsules | 36 g |
| Magenta Capsules | 30 g |
| Yellow Capsules | 34 g |
| Dow Binder (Dow Additive Q1-6106 from Dow Chemical Co.) | 10 g |

This composition can be coated on both sides of an opaque PET support (Melinex) at a coat weight of 10 g/m².

The following developer composition was applied to a transparent PET film in a coat weight of 12 g/sq. m:

| | |
|---|---|
| Phenolic Resin (HRJ 4542 from Schenectady Chemical Co. | 96 g |
| Polyvinyl alcohol (airvol grade 205 from Air Products Co.) | 4 g |

To prepare a film unit, two films coated with developer can be assembled with a support coated with microcapsules in a facing relationship and the edges of the two supports can be sealed using Ashland's PS 508 adhesive.

EXAMPLE 2

The following coating composition can be prepared and coated on a PET support:

| | |
|---|---|
| Cyan Capsules (Ex. 1) | 36 g |
| Magenta Capsules (Ex. 1) | 30 g |
| Yellow Capsules (Ex. 1) | 34 g |
| Dow Binder (Ex. 1) | 10 g |
| HRJ 4542 Developer (Schenectady Chemical Co.) | 90 g |
| PVA (airvol grade 205 from Air Products Co.) | 10 g |

To prepare a film unit in accordance with the invention, two sheets coated as above can be assembled with a white PET film coated on both sides with Ashland's PS 508 adhesive and sealed to form a film unit which can be imagined on both sides.

Having described the invention in detail and by reference to preferred embodiments thereof, it will be apparent that modifications and variations are possible without departing from the scope of the invention as defined in the following claims.

What is claimed is:

1. A self-contained photohardenable imaging assembly comprising:

first and second transparent polymeric film supports, an opaque support, and an imaging unit disposed between said first and second transparent supports on each side of said opaque support, each of said imaging units including a plurality of photosensitive microcapsules containing a chromogenic material and a developer material wherein by imagewise exposing each of said imaging units to actinic radiation and subjecting the imaging assembly to pressure, images can be formed in the imaging units on each side of said opaque support.

2. The imaging assembly of claim 1 wherein said microcapsules include a first set of microcapsules containing:

a cyan color precursor, a second set of microcapsules containing a magenta color precursor, and a third set of microcapsules containing a yellow color precursor, each of said microcapsules further containing a photohardenable composition such that full color images can be obtained.

3. The imaging assembly of claim 2 wherein said first set of microcapsules is sensitive to red light, said second set of microcapsules is sensitive to blue light, and said third set of microcapsules is sensitive to green light.

4. The imaging assembly of claim 1 wherein said assembly is sealed such that the user of the assembly cannot come into contact with the contents of the assembly without destroying the assembly.

5. The imaging assembly of claim 1 wherein said imaging unit includes a mixed layer of microcapsules and developer material.

6. The imaging assembly of claim 1 wherein said imaging unit includes a layer of microcapsules and a separate layer of developer material.

7. The imaging assembly of claim 6 wherein each of said transparent supports includes an inside surface and said developer layer is provided on the inside surface of said transparent supports, and said microcapsule layer is provided on each surface of said opaque support.

8. The imaging assembly of claim 6 wherein each of said transparent supports includes an inside surface and a subbing layer is provided on the inside surfaces of said transparent supports, and said mixed layer of microcapsules and developer is provided on said subbing layer, and said transparent supports are bonded to each surface of said opaque supports by a layer of an adhesive.

9. The imaging assembly of claim 2 wherein said first, second and third sets of microcapsules are sensitive to visible, ultraviolet, or infrared radiation.

10. The imaging assembly of claim 1 wherein said opaque support is a plastic film containing a white pigment.

* * * * *